(12) United States Patent
Kim et al.

(10) Patent No.: US 8,174,822 B2
(45) Date of Patent: May 8, 2012

(54) PLASMA DISPLAY DEVICE

(75) Inventors: Chul-Hong Kim, Suwon-si (KR);
Jung-Keun Ahn, Suwon-si (KR);
Hyun-Mi Jeong, Suwon-si (KR);
Sung-Bae Kim, Suwon-si (KR);
Bu-Kyeong Mo, Suwon-si (KR);
Jeong-Rok Cha, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 655 days.

(21) Appl. No.: 11/978,629

(22) Filed: Oct. 30, 2007

(65) Prior Publication Data
US 2008/0101002 A1    May 1, 2008

(30) Foreign Application Priority Data

Oct. 31, 2006    (KR) ......................... 10-2006-0106682

(51) Int. Cl.
*H05K 5/00*    (2006.01)
*H05K 7/00*    (2006.01)
*G02F 1/1333*    (2006.01)
*G09G 3/28*    (2006.01)
*G03F 1/1345*    (2006.01)

(52) U.S. Cl. ................. 361/679.01; 361/679.21; 349/58; 349/149; 349/150; 349/151; 349/152; 345/60

(58) Field of Classification Search ............. 361/679.21, 361/679.01, 679.02; 349/58, 149–152; 348/836, 348/797; 313/582–587; 345/60, 905
See application file for complete search history.

(56) References Cited

U.S. PATENT DOCUMENTS

| 5,753,720 | A | 5/1998 | Nakanishi et al. | |
|---|---|---|---|---|
| 5,777,713 | A * | 7/1998 | Kimura | 349/156 |
| 6,086,441 | A | 7/2000 | Akiguchi et al. | |
| 6,738,123 | B1 * | 5/2004 | Takahashi et al. | 349/152 |
| 6,923,703 | B2 | 8/2005 | Furukawa | |
| 6,940,227 | B2 | 9/2005 | Aoki et al. | |
| 7,557,502 | B2 | 7/2009 | Schlenker | |
| 2002/0024302 | A1 | 2/2002 | Wu et al. | |
| 2003/0020152 | A1 * | 1/2003 | Inoue et al. | 257/684 |
| 2006/0028601 | A1 * | 2/2006 | Kawahara et al. | 349/117 |
| 2006/0103595 | A1 | 5/2006 | Kim et al. | |
| 2006/0170837 | A1 * | 8/2006 | Asami et al. | 349/50 |
| 2007/0018577 | A1 * | 1/2007 | Hwang | 313/582 |
| 2008/0186662 | A1 * | 8/2008 | Lee | 361/681 |

FOREIGN PATENT DOCUMENTS

| CN | 1 617 635 | 5/2005 |
|---|---|---|
| JP | 56-55874 U | 5/1981 |
| JP | 60-154232 A | 8/1985 |
| JP | 03-184077 | 8/1991 |
| JP | 4-66041 U | 6/1992 |

(Continued)

*Primary Examiner* — Robert J Hoffberg
*Assistant Examiner* — Jerry Wu
(74) *Attorney, Agent, or Firm* — Lee & Morse, P.C.

(57) ABSTRACT

A plasma display device includes a plasma display panel (PDP) having electrodes between front and rear substrates, a chassis base on an outer surface of the PDP, a printed circuit board assembly (PBA) on the chassis base, a flexible printed circuit (FPC) connecting the PBA to the electrodes of the PDP, an anisotropic conductive film between terminals of the electrodes and a terminal of the FPC, and a sealing member surrounding the terminals of the electrodes and the terminal of the FPC, the sealing member including a surface hydrophobic modifying layer and an insulation layer.

18 Claims, 5 Drawing Sheets

FOREIGN PATENT DOCUMENTS

| | | | |
|---|---|---|---|
| JP | 05286084 A | * | 11/1993 |
| JP | 09-087612 A | | 3/1997 |
| JP | 09-208829 A | | 8/1997 |
| JP | 10-324806 A | | 12/1998 |
| JP | 2000-090840 | | 3/2000 |
| JP | 2000104047 A | * | 4/2000 |
| JP | 2001-015042 | | 1/2001 |
| JP | 2001-215898 A | | 8/2001 |
| JP | 2001-354949 A | | 12/2001 |
| JP | 2003-195336 A | | 7/2003 |
| JP | 2003-295786 A | | 10/2003 |
| JP | 2003-330005 A | | 11/2003 |
| JP | 2004-086134 A | | 3/2004 |
| JP | 2005-038636 | | 2/2005 |
| JP | 2005-506666 T | | 3/2005 |
| JP | 2005-353500 A | | 12/2005 |
| JP | 2006-049917 | | 2/2006 |
| KR | 10-2002-0080500 A | | 10/2002 |
| WO | WO 03/034513 A1 | | 4/2003 |
| WO | WO 2005/066992 | | 7/2005 |

* cited by examiner

PLASMA DISPLAY DEVICE

BACKGROUND OF THE INVENTION

1. Field of the Invention

Embodiments of the present invention relate to a plasma display device. More particularly, embodiments of the present invention relate to a plasma display device having a sealing member to prevent an electrical opening or short of electrode terminals thereof.

2. Description of the Related Art

In general, a plasma display device may include a plasma display panel (PDP), a chassis base that supports the PDP, and a plurality of printed circuit board assemblies (PBAs). The PDP may display images by generating red (R), green (G), and/or blue (B) light via a gas discharge phenomenon, i.e., triggering vacuum ultra-violet (VUV) light in plasma discharge gas, thereby exciting a photoluminescent material to emit visible light. The gas discharge phenomenon may be triggered by application of voltage to the discharge gas via electrodes controlled by the PBAs.

Each of the PBAs of the conventional plasma display device may control a corresponding set of electrodes, i.e., sustain electrodes, scan electrodes, and/or address electrodes, and may be connected thereto through a flexible printed circuit (FPC) and a connector, e.g., an anisotropic conductive film (ACF). For example, an address buffer board may control a plurality of address electrodes positioned on a rear substrate of the PDP, and may be connected to terminals of the address electrodes via the FPC. The electrodes of the PDP may be fabricated of a photosensitive silver through, e.g., printing, drying, light exposure, development, and/or baking.

However, in addition to exhibiting high electrical conductivity, silver may exhibit self-diffusion and migration characteristics. In other words, silver may interact with, e.g., moisture in the air, and become ionized, thereby causing openings and/or electrical shorts of the electrode terminals. Open and/or shorted electrode terminals may cause line defects in the PDP. For example, when terminals of the address electrodes are exposed to external atmospheric conditions, i.e., moisture, oxygen, organic/inorganic impurities, and so forth, the PDP may have defects in vertical lines thereof, i.e., a vertical line defect. Such lines defects may cause PDP discharge defects, brightness deterioration, inferior driving properties, and an overall reduced lifespan of the PDP.

Attempts have been made to seal a connection area between the electrode terminals and the FPC in order to minimize exposure of the electrode terminals to external atmospheric conditions. However the conventional sealing material may exhibit low adherence characteristics and a high water-vapor transmission rate, thereby causing corrosion and/or oxidation resulting in electrical openings or shorts. Accordingly, there exists a need for an improved sealing material to minimize contact between the electrode terminals and the external atmosphere.

SUMMARY OF THE INVENTION

Embodiments are therefore directed to a plasma display device, which substantially overcomes one or more of the problems due to the limitations and disadvantages of the related art.

It is therefore a feature of an embodiment of the present invention to provide a plasma display device with a sealing member having improved adherence and sealing properties.

At least one of the above and other features of the present invention may be realized providing a plasma display device, including a plasma display panel (PDP) having electrodes between front and rear substrates, a chassis base on the PDP, printed circuit board assemblies (PBAs) on the chassis base, a flexible printed circuit (FPC) connecting the PBAs to the electrodes of the PDP, an anisotropic conductive film between terminals of the electrodes and a terminal of the FPC, and a sealing member surrounding the terminals of the electrodes and the terminal of the FPC, the sealing member including a surface hydrophobic modifying layer and an insulation layer.

The surface hydrophobic modifying layer may include a polysiloxane-based resin. The polysiloxane-based resin may include a siloxane resin, an alkyl silicate, or a combination thereof. The alkyl silicate may include one or more of C1 to C8 alkyl groups. The alkyl silicate may be one or more of methyl silicate, ethyl silicate, propyl silicate, isopropyl silicate, butyl silicate, and/or isobutyl silicate. The insulation layer may include one or more of a silicone resin, an epoxy resin, a styrene resin, a phenol resin, and/or a urethane resin.

The insulation layer and the surface hydrophobic modifying layer may be two discrete layers. The insulation layer may be between the surface hydrophobic modifying layer and the electrode terminals. The surface hydrophobic modifying layer may be between the insulation layer and the electrode terminals. The sealing member may have a single layer structure and the and the single layer may include a mixture of an hydrophobic material and an insulating material. The sealing member may exhibit a water-vapor transmission rate of about 30 to 50 g/cm$^2$ per day. The sealing member may exhibit adhesion strength of about 5.0 to 5.7 MPa.

The sealing member may include a first sealing portion in contact with the terminal of the FPC and with the front substrate, and a second sealing portion in contact with the terminals of the electrodes, the terminal of the FPC, and the rear substrate. The first and second sealing portions may have a diagonal structure. The sealing member may be in direct contact with the terminals of the electrodes and the FPC.

At least one of the above and other features of the present invention may be further realized providing a method of manufacturing a plasma display device, including attaching a chassis base on a plasma display panel (PDP), the PDP having electrodes between front and rear substrates, mounting a printed circuit board assembly (PBA) on the chassis base, electrically connecting the PBA to the electrodes of the PDP via a flexible printed circuit (FPC), such that an anisotropic conductive film is formed between terminals of the electrodes and a terminal of the FPC, and forming a sealing member of a surface hydrophobic modifying layer and an insulation layer, such that the terminals of the electrodes and the FPC are enclosed by the sealing member.

Forming the sealing member may include forming the insulation layer between the surface hydrophobic modifying layer and the terminals of the electrodes. Forming the sealing member may include forming the surface hydrophobic modifying layer between the insulation layer and the terminals of the electrodes. Forming the sealing member may include applying the insulation layer and the surface hydrophobic modifying layer simultaneously on the terminals of the electrodes. Forming the sealing member may include curing the surface hydrophobic modifying layer and the insulation layer by heat-curing or UV curing. Forming the sealing member may include forming the surface hydrophobic modifying layer of one or more of a siloxane resin, an alkyl silicate, or a combination thereof.

BRIEF DESCRIPTION OF THE DRAWINGS

The above and other features and advantages of embodiments of the present invention will become more apparent to those of ordinary skill in the art by describing in detail exemplary embodiments thereof with reference to the attached drawings, in which:

FIG. 1 illustrates an exploded perspective view of a plasma display device in accordance with an embodiment of the present invention.

DETAILED DESCRIPTION OF THE INVENTION

Figure 1:
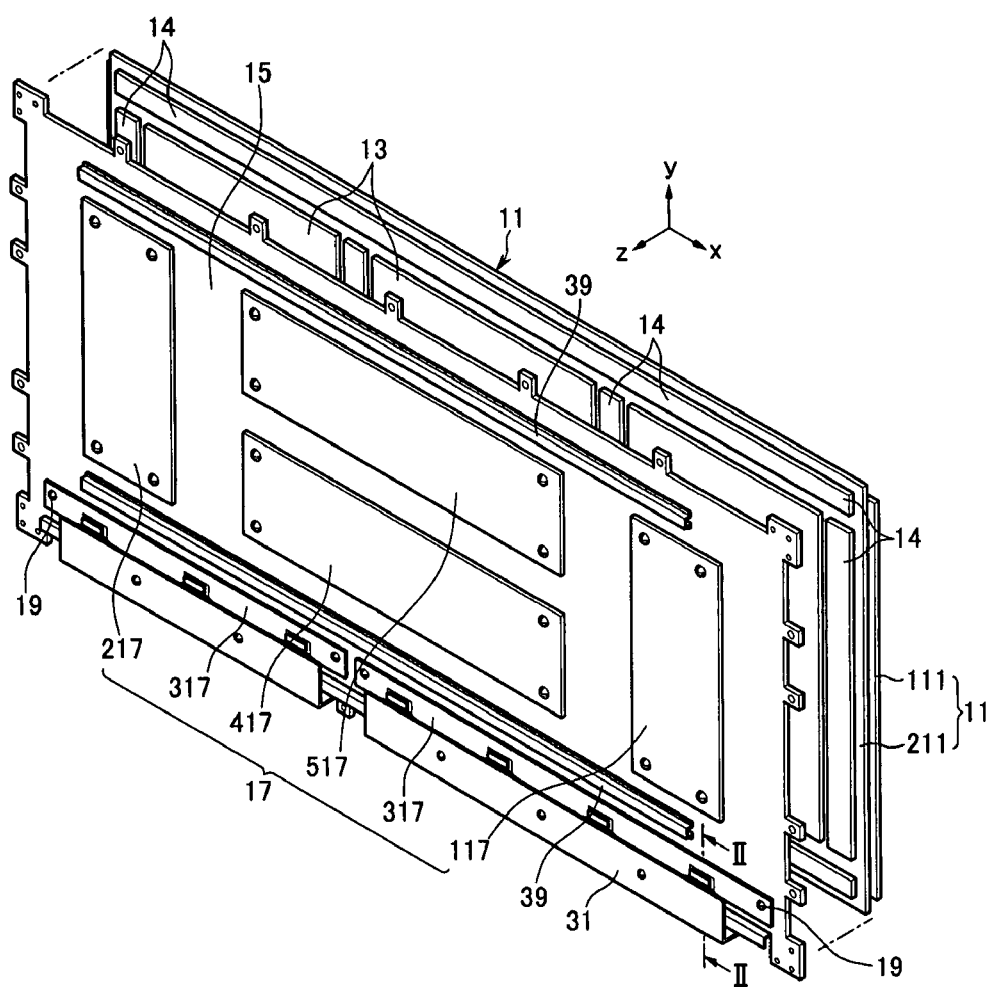

Korean Patent Application No. 10-2006-0106682, filed on Oct. 31, 2006, in the Korean Intellectual Property Office and entitled: "Plasma Display Device," is incorporated by reference herein in its entirety.

Embodiments of the present invention will now be described more fully hereinafter with reference to the accompanying drawings, in which exemplary embodiments of the invention are illustrated. Aspects of the invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

An exemplary embodiment of a plasma display device according the present invention will be described in more detail below with reference to FIGS. 1-4. Electrodes of a plasma display panel (PDP) may be electrically connected to terminals of a flexible printed circuit (FPC) for driving. A connection part between the electrodes and terminals of the FPC may be sealed with a sealing member in order to protect it from external moisture or impurities. The sealing member may include a surface hydrophobic modifying layer to thoroughly prevent infiltration of external moisture. The sealing member may minimize self-migration of a silver electrode, and may have an increased stability at a high temperature. Thereby, the sealing member may reduce shrinkage or expansion of electrode terminals as a result of external environmental changes to prevent electrical openings or shorts of electrode terminals.

Figure 2:
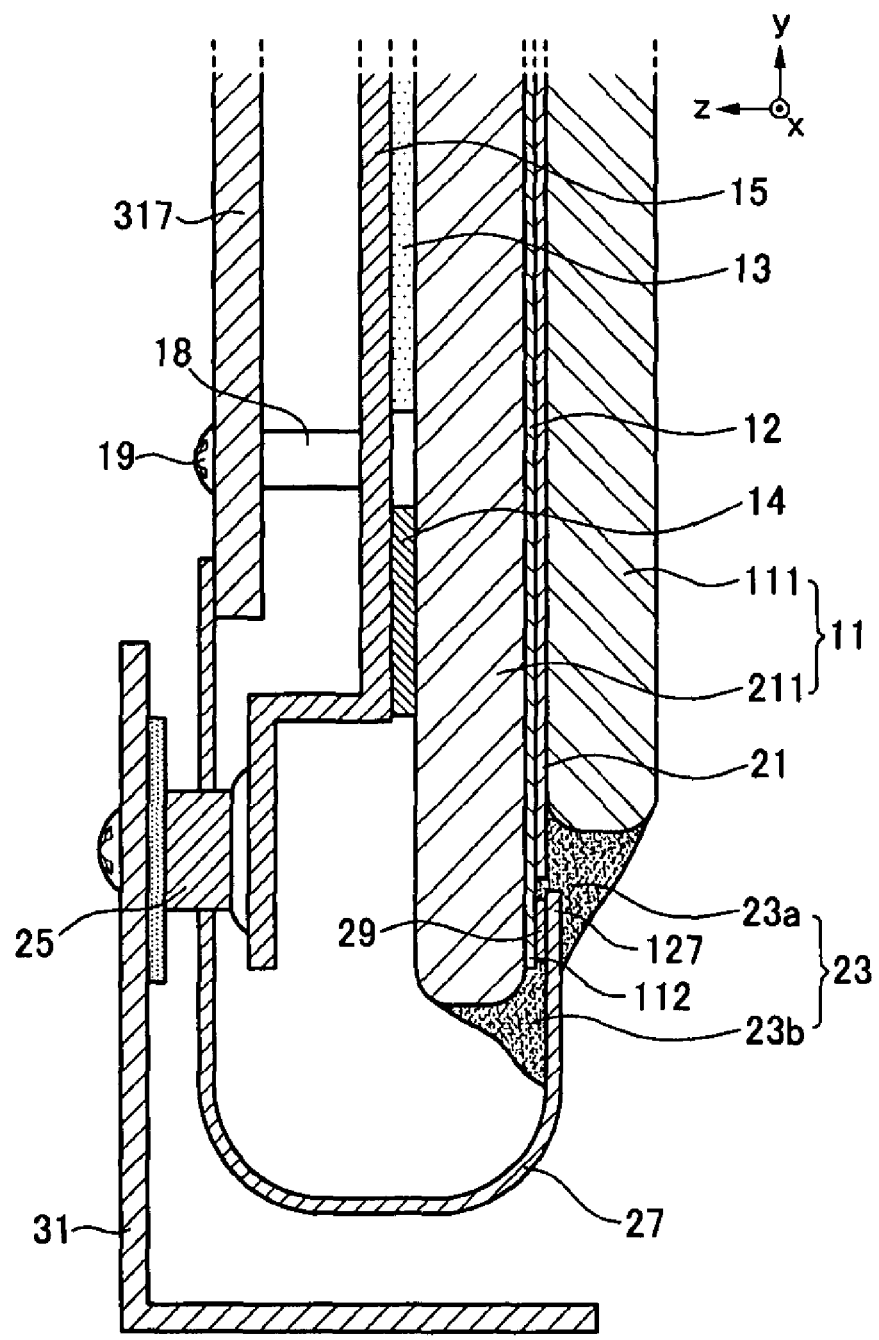
FIG. 2 illustrates an assembled cross-sectional view along line II-II of the plasma display device of FIG. 1.

As illustrated in FIGS. 1-2, a plasma display device may include a plasma display panel (PDP) 11 for displaying images using a gas discharge phenomenon, heat dissipation sheets 13, a chassis base 15, printed circuit board assemblies (PBAs) 17, and a flexible printed circuit (FPC) 27 between each PBA 17 and a corresponding set of electrodes, so that each connection region between the FPC 27 and a respective electrode terminal may be sealed with a sealing member 23.

The PDP 11 of the plasma display device may include front and rear substrates 111 and 211, respectively, formed of, e.g., glass, and integrally bonded to each other by means of a sealant (not shown). Discharge cells (not shown) filled with a discharge gas may be formed between the front and rear substrates 111 and 211 to facilitate visible light emission upon plasma generation. In particular, the PDP 11 may include discharge electrodes (not shown), i.e., sustain and scan electrodes, and address electrodes 12 to trigger discharge in the discharge cells. The electrodes of the PDP 11 may be formed of, e.g., silver. The PDP 11 may use the gas discharge to display images, e.g., increased discharge sustain time may increase brightness of the PDP 1. The PDP 11 may be any suitable PDP.

The heat dissipation sheets 13 of the plasma display device may be attached to a rear surface of the PDP 11, i.e., a surface facing away from the a displayed image, to diffuse heat generated by the gas discharge of the PDP 11, e.g., during increased sustain discharge time. The heat dissipation sheets 13 may be made of a heat dissipation material, e.g., acryl-based material, graphite-based material, metal-based material, carbon nanotubes, and so forth, and may diffuse the generated heat along the xy-plane, as illustrated in FIG. 1.

The chassis base 15 of the plasma display device may be attached to the rear surface of the PDP 11, so the heat dissipation sheets 13 may be interposed between the PDP 11 and the chassis base 15, as illustrated in FIG. 1. The chassis base 15 may be formed of, e.g., metal, and may be attached to the PDP 11 with a double-sided adhesive tape 14 to mechanically support the PDP 11, as further illustrated in FIG. 1. At least one reinforcement member 39 may be provided on a rear surface of the chassis base 15, e.g., a thin longitudinal member along the x-axis in upper and/or lower horizontal portions of the chassis base 15, to increase the mechanical rigidity of the chassis base 15. The chassis base 15 may further include a cover plate 31 in a lower portion thereof, as further illustrated in FIG. 1. The chassis base 15 may minimize and/or prevent electromagnetic interference (EMI), and may have sufficient mechanical strength to support the PDP 11 and the PBAs 17.

The PBAs 17 of the plasma display device may be mounted on the rear surface of the chassis base 15, and may be electrically connected to the PDP 11 to facilitate driving thereof. As illustrated in FIG. 2, the PBAs 17 may be attached to the chassis base 15 via a plurality of bosses 18 and setscrews 19. The PBAs 17 may include a plurality of circuits to drive different elements of the PDP 11. For example, as illustrated in FIG. 1, the PBAs 17 may include a sustain board 117 for controlling the sustain electrodes (not shown), a scan board 217 for controlling the scan electrodes (not shown), an address buffer board assembly 317 for controlling the address electrodes 12, an image processing/control board 417 for receiving video signals from an external source and generating corresponding control signals for driving the different PBAs 17, and a power board 517 for supplying power to drive the PBAs 17.

Figure 3:
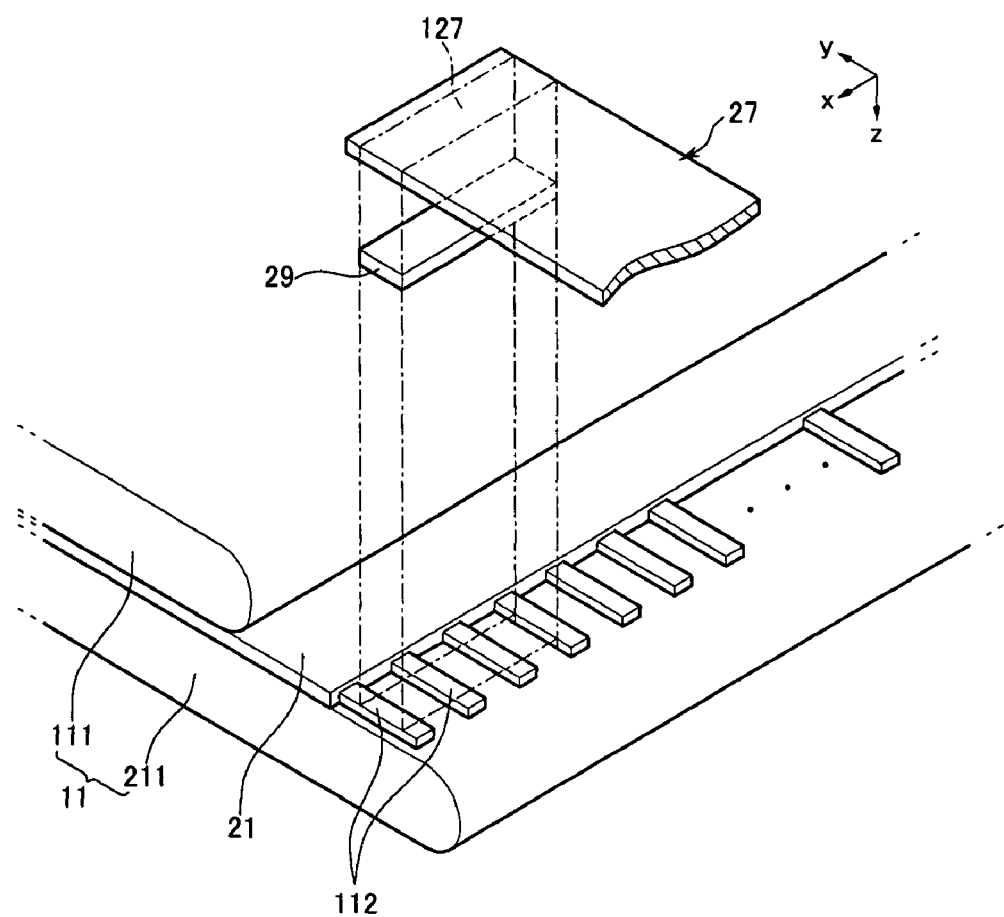
FIG. 3 illustrates an exploded, enlarged perspective view of a connection area between electrode terminals and a flexible printed circuit of the plasma display device of FIG. 1.

Each of the PBAs 17 may be connected to a respective electrode set via, e.g., a flexible printed circuit (FPC) and a connector. For example, as illustrated in FIGS. 2-3, the address buffer board assembly 317 may be connected to the address electrodes 12 through the FPC 27. In this respect, it should be noted that even though the connection described herein is between the address buffer board assembly 317 and one address electrodes 12, connections between the address buffer board assembly 317 and each one of the address electrodes 12, between the sustain board 117 and a transparent electrode of each of the sustain electrodes, and between the scan board 217 and a bus electrode of each of the scan electrodes may be substantially similar, and therefore, will not be described separately herein.

As illustrated in FIGS. 2-3, one end of the FPC 27, i.e., a terminal 127 thereof, may be connected to an electrode terminal 112 of at least one address electrode 12 by interposing an anisotropic conductive film 29 therebetween. The sealing member 23 may seal the connection between the FPC 27, electrode terminal 112, and the anisotropic conductive film 29, as further illustrated in FIG. 2. The FPC 27 may be bent around a lower portion of the chassis base 15 and the address buffer board assembly 317, e.g., have a "U"-shape, so that another end of the FPC 27 may be connected to the address buffer board assembly 317 via a driver integrated circuit (IC) package 25. The driver IC package 25 may generate address control signals to be transferred to the address electrode 12, and may be, e.g., a Chip On Film (COF) type, a Chip on Board (COB) type, a tape carrier package (TCP) type, and so forth.

The sealing member 23 may be formed of a surface hydrophobic modifying layer and of an insulation layer, as will be discussed in more detail below with respect to FIG. 4, and may include a first sealing portion 23*a* and a second sealing portion 23*b*. As illustrated in FIG. 2, the first and second sealing portions 23*a* and 23*b* may have a diagonal structure, i.e., may be disposed diagonally across from each other on opposite surfaces of the FPC 27 in the yz-plane. For example, the first sealing portion 23*a* may be formed in communication with the FPC 27 and front substrate 111, while the second sealing portion 23*b* may be formed in communication with the electrode terminals 112, FPC 27, and rear substrate 211.

To be specific, the first sealing portion 23*a* may seal a lower end of a dielectric layer 21 covering the address electrode 12, a portion of the address electrode facing the front substrate 111, and an upper portion of the anisotropic conductive film 29. Accordingly, portions of the address electrode 12 not covered by the dielectric layer 21 and the anisotropic conductive film 29 may be sealed by the first sealing portion 23*a*. The second sealing member 23*b* may seal lower portions of the address electrode 12 and anisotropic conductive film 29, so the electrode terminals 112 exposed between the rear substrate 211 and the FPC 27 may be sealed. In other words, the sealing member 23 may completely seal the connection between the FPC 27 and the electrode terminals 112 of the address electrodes 12 from external atmospheric conditions, so that electrode terminals 112 formed of silver may be prevented from being opened or shorted due to migration or self-diffusion of the silver.

Figure 4:
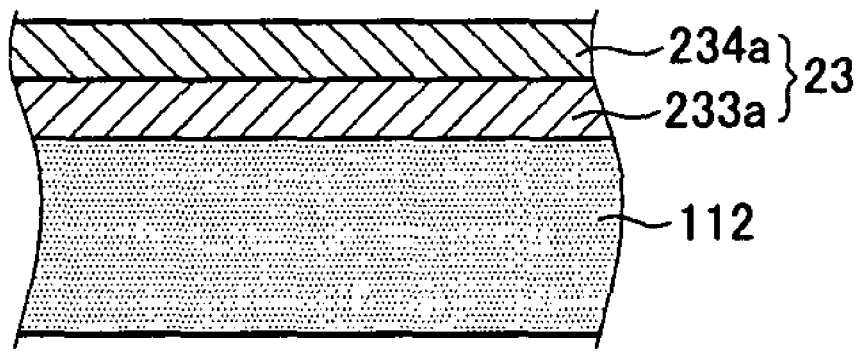
FIG. 4 illustrates a cross-sectional view of a sealing member according to an embodiment of the present invention.

As illustrated in FIG. 4, the sealing member 23 may include a surface hydrophobic modifying layer 233*a* and an insulation layer 234*a*, so that the sealing member 23 may exhibit sufficient adhesive strength and low water-vapor transmission rate. As further illustrated in FIG. 4, the surface hydrophobic modifying layer 233*a* and the insulation layer 234*a* may be two discrete layers in communication with each other, i.e., having a single and continuous interface therebetween. More specifically, the surface hydrophobic modifying layer 233*a* may be interposed between the electrode terminals 112 and the insulation layer 234*a*. The fabrication method of the sealing member 23 may be selected according to specific materials used therein.

The surface hydrophobic modifying layer 233*a* may be formed of a hydrophobic material, e.g., a polysiloxane. More specifically, the surface hydrophobic modifying layer 233*a* may include a dispersion of one or more of siloxane resin and/or an alkyl silicate in a solvent. The alkyl silicate may include a C1 to C8 alkyl group, e.g., at least one of methyl silicate, ethyl silicate, propyl silicate, isopropyl silicate, butyl silicate, isobutyl silicate, and/or a combination thereof. The solvent may include an alcohol, e.g., ethanol, propanol, isopropanol, butanol, and so forth, an ether, e.g., ethylene-glycol monoethylether, and/or an ester, e.g., ethyleneglycol monoethylether acetate, 3-methoxybutyl acetate, and so forth. One or more of the siloxane resin and/or the alkyl silicate may be dispersed in the solvent, and may be applied to the electrode terminals 112 by a wet coating method, e.g., printing and/or spray coating, followed by drying to form the surface hydrophobic modifying layer 233*a* on the electrode terminals 112.

The insulation layer 234*a* may include one or more of a silicone resin, an epoxy resin, a styrene resin, a phenol resin, and/or a urethane resin. The insulation layer 234*a* may be wet-coated on the dried surface hydrophobic modifying layer 233*a*, dried, and solidified, e.g., cured by thermal treatment or ultraviolet (UV) solidification, to finalize formation of the sealing member 23. If thermal solidification is performed, a temperature of about 25° C. to about 400° C. may be used.

Figure 5:
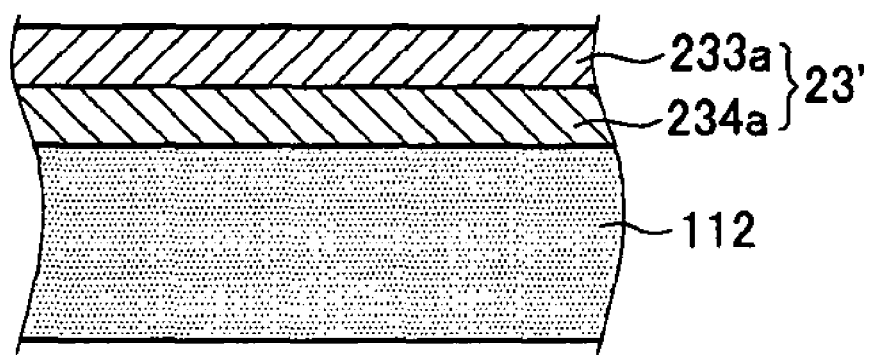
FIG. 5 illustrates a cross-sectional view of a sealing member according to another embodiment of the present invention.

Alternatively, as illustrated in FIG. 5, a sealing member 23' may include the insulation layer 234*a* between the electrode terminals 112 and the surface hydrophobic modifying layer 233*a*. The composition and preparation method of the sealing member 23' may be substantially similar to those of the sealing member 23 described previously with respect to FIG. 4 with the exception of coating sequence of the insulation layer 234*a* and the surface hydrophobic modifying layer 233*a*. In other words, the insulation layer 234*a* may be wet coated and dried on the electrode terminals 112, followed by wet coating, drying, and curing of the surface hydrophobic modifying layer 233*a* thereon.

Figure 6:
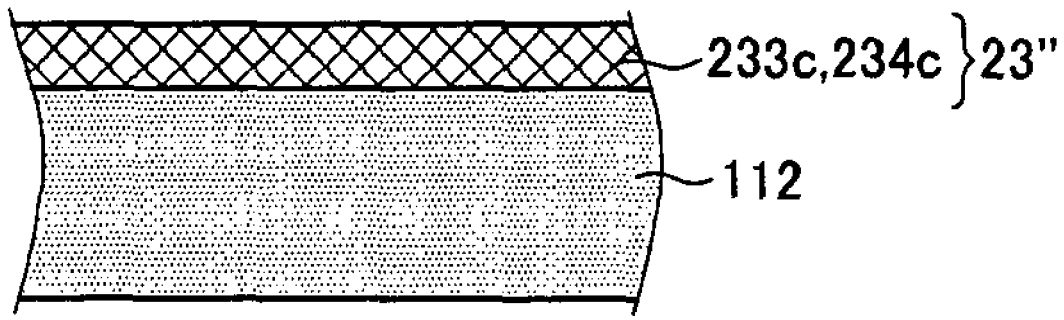
FIG. 6 illustrates a cross-sectional view of a sealing member according to another embodiment of the present invention.

In yet another alternative, as illustrated in FIG. 6, a sealing member 23" may be formed on the electrode terminals 112, and may have a single layer structure. In other words, the sealing member 23" may include a mixture of an insulation layer 234*c* and a surface hydrophobic modifying layer 233*c* on the electrode terminals 112. More specifically, the insulation layer 234*c* and surface hydrophobic modifying layer 233*c* may have a substantially similar composition to the insulation layer 234*a* and surface hydrophobic modifying layer 233*a*, respectively, described previously with respect to FIG. 4. However, the insulation layer 234*c* and surface hydrophobic modifying layer 233*c* may be deposited simultaneously on the electrode terminals 112. For example, the insulation layer 234*c* and surface hydrophobic modifying layer 233*c* may be pre-mixed to form a uniform mixture prior to application thereof onto the electrode terminals 112, so the sealing member 23" may have a single-layer structure. Once the insulation layer 234*c* and surface hydrophobic modifying layer 233*c* are wet coated onto the electrode terminals 112, the sealing member 23" may be dried and cured to finalize formation thereof.

The sealing members 23, 23', and 23" according to embodiments of the present invention may have a water-vapor transmission rate of about 30 to about 50 g/cm$^2$ per day and an adhesion strength of about 5.0 to about 5.7 MPa.

Accordingly, incorporating the sealing member according to embodiments of the present invention into a plasma display device may be advantageous in preventing or substantially minimizing penetration of external moisture, oxygen, and/or other impurities into the plasma display device. The sealing member may substantially minimize migration of silver between adjacent electrode terminals, and may exhibit enhanced stability at high temperatures. Accordingly, the sealing member according to embodiments of the present invention may substantially reduce shrinkage or expansion of electrode terminals as a result of external environmental changes, thereby preventing electrical openings or shorts of electrode terminals.

EXAMPLES

Three samples of sealing members were prepared according to embodiments of the present invention, i.e., Examples 1-3. Examples 1-3 were compared to Comparative Examples 1-2 in terms of adhesion strengths at different conditions and water-vapor transmission rate. The physical sizes, shapes, and composition of the substrates in Examples 1-3 and Comparative Examples 1-2 were identical. The physical sizes and shapes of the sealing members in Examples 1-3 and Comparative Examples 1-2 were identical. Also, the silicone resin used in Examples 1-3 and Comparative Examples 1-2 was identical. Preparations of all compositions and application thereof to respective substrates were performed at standard temperature and humidity unless indicated otherwise.

Example 1 an ethyl silicate solution (40 w/v (%) of ethanol dispersion) was coated on a substrate and dried. A layer of silicone resin was coated on the dried ethyl silicate layer and heat-cured at 45° C. to form a sealing member.

Example 2 a silicone resin was coated on a substrate and dried. An ethyl silicate solution (40 w/v (%) of ethanol dispersion) was coated on the dried silicone resin layer and heat-cured at 40° C. to form a sealing member.

Example 3 ethyl silicate and a silicone resin were mixed at a weight ratio of 1:1 in ethanol to prepare a solution. The prepared solution was coated on a substrate, dried, and heat-cured at 40° C. to form a sealing member.

Comparative Example 1 a silicone resin was coated on a substrate, dried, and cured by UV to form a sealing member.

Comparative Example 2 a silicone resin was coated on a substrate and dried to form a sealing member. The silicone resin layer was only dried and not solidified.

Adhesion strength of each of the sealing members prepared according to Examples 1-3 and Comparative Examples 1-2 was measured using an Instron 6022 tensile measuring device (500 g load and 90° peel-off). An edge of each of the sealing members was exfoliated from the substrate using a polyimide (PI) T-joint, and the exfoliated edge of the sealing member was pulled apart from the substrate at a speed of 5 mm/min at a normal state load. The maximum force required to pull the sealing member completely apart from the substrate was recorded. The results are presented in Table 1 below. Referring to Table 1 below, the sealing members of Examples 1-3 showed higher adhesion strength, as compared to Comparative Examples 2-3.

TABLE 1

|  | Example 1 | Example 2 | Example 3 | Comparative Example 1 | Comparative Example 2 |
| --- | --- | --- | --- | --- | --- |
| Adhesion strength | 5.2 MPa | 5.7 MPa | 5.0 MPa | 4.8 MPa | 2.0 MPa |

Water-vapor transmission rate of each of the sealing members was determined as follows. An initial weight of each sample was determined. Next, each sample was immersed in tap water and maintained therein at a temperature of 40° C. for 24 hours. After 24 hours, a weight of each sample was measured and compared to the initial weight of each sample. A weight difference after 24 hours of immersion in water of each sample was reported. The measurement results are presented in Table 2 below. As illustrated in Table 2, the sealing members of Examples 1-3 exhibited lower water-vapor transmission rates, i.e., lower water absorption, as compared to Comparative Examples 1-2, thereby signifying that moisture penetration was substantially reduced by the sealing members of Examples 1-3.

TABLE 2

|  | Example 1 | Example 2 | Example 3 | Comparative Example 1 | Comparative Example 2 |
| --- | --- | --- | --- | --- | --- |
| Water-vapor transmission rate (g/cm$^2$, per day) | 41 | 32 | 50 | 58 | 78 |

Adhesion strength of each sealing members of Examples 1-3 and Comparative Examples 1-2 was also determined under high temperature and high humidity conditions. More specifically, each sealing member was placed in a sealed chamber at 50° C. and 90% relative humidity for 5 days. Adhesion strength before and after placement in the sealed chamber was determined with the Instron 6022 tensile measuring device (500 g load and 90° peel-off) as described above. The results are shown in Table 3 below.

TABLE 3

|  | Example 1 | Example 2 | Example 3 | Comparative Example 1 | Comparative Example 2 |
| --- | --- | --- | --- | --- | --- |
| Adhesion strength (before) | 5.2 MPa | 5.7 MPa | 5.0 MPa | 4.8 MPa | 2.0 MPa |
| Adhesion strength (after) | 5.1 MPa | 5.5 MPa | 4.6 MPa | 3.9 MPa | 1.5 MPa |
| Adhesion strength variation | 1.9% | 3.5% | 8.0% | 18.75% | 25% |

Referring to Table 3, the sealing members of Examples 1-3 showed little or negligible change in adhesion strength as a result of high temperature and humidity conditions, thus producing highly reliable data. On the other hand, the sealing members of Comparative Examples 1-2 showed a relatively large change in adhesion strength, i.e., respective strength decrease of 18.75% and 25%. The results signify that the sealing effect of the sealing members of Comparative Examples 1-2 may substantially deteriorate at high temperature/humidity conditions.

As described above, the sealing member including the surface hydrophobic modifying layer that includes a polysiloxane-based resin may prevent electrical openings or shorts of electrode terminals.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
   a plasma display panel (PDP) having electrodes between front and rear substrates;
   a chassis base on the PDP;
   printed circuit board assemblies (PBAs) on the chassis base;
   a flexible printed circuit (FPC) connecting the PBAs to the electrodes of the PDP;
   an anisotropic conductive film between terminals of the electrodes and a terminal of the FPC, the electrodes and the terminals of the electrodes including silver;
   a dielectric layer between the electrodes and the front substrate, exposed portions of the electrodes including silver being arranged between the anisotropic conductive film and the dielectric layer; and
   a sealing member surrounding the anisotropic conductive film, the terminals of the electrodes, and the terminal of the FPC, the sealing member including:
      a first sealing portion in contact with the exposed portions of the electrodes, the terminal of the FPC, and the front substrate, and
      a second sealing portion in contact with the terminals of the electrodes, the FPC, and the rear substrate,
   both the first sealing portion and the second sealing portion including a surface hydrophobic modifying layer and an insulation layer therein, such that the sealing member includes therein a plurality of hydrophobic modifying layers and a plurality of insulation layers,
   wherein the surface hydrophobic modifying layers in the first and second sealing portions include an alkyl silicate.

2. The plasma display device as claimed in claim 1, wherein the insulation layer and the surface hydrophobic modifying layer of the first and second sealing portions are two discrete layers.

3. The plasma display device of claim 2, wherein one of the plurality of surface hydrophobic modifying layers is between an adjacent insulation layer of the plurality of insulation layers and the terminals of the electrodes.

4. The plasma display device of claim 2, wherein one of the plurality of insulation layers is between an adjacent surface hydrophobic modifying layer of the plurality of surface hydrophobic modifying layers and the terminals of the electrodes.

5. The plasma display device of claim 1, wherein the surface hydrophobic modifying layer and the insulation layer of the first sealing portion are integrally formed and the surface hydrophobic modifying layer and the insulation layer of the second sealing portion are integrally formed.

6. The plasma display device of claim 1, wherein the alkyl silicate includes one or more of C1 to C8 alkyl group.

7. The plasma display device as claimed in claim 1, wherein the alkyl silicate is one or more of methyl silicate, ethyl silicate, propyl silicate, isopropyl silicate, butyl silicate, and/or isobutyl silicate.

8. The plasma display device of claim 7, wherein the insulation layers of the first and second sealing portions include one or more of a silicone resin, an epoxy resin, a styrene resin, a phenol resin, and/or a urethane resin.

9. The plasma display device as claimed in claim 1, wherein the sealing member exhibits a water-vapor transmission rate of about 30 to 50 $g/cm^2$ per day.

10. The plasma display device as claimed in claim 1, wherein the sealing member exhibits an adhesion strength of about 5.0 to 5.7 MPa.

11. The plasma display device as claimed in claim 1, wherein the first and second sealing portions have a diagonal structure.

12. A method of manufacturing a plasma display device, comprising:
   attaching a chassis base on a plasma display panel (PDP), the PDP having electrodes between front and rear substrates, the electrodes including silver;
   mounting a printed circuit board assembly (PBA) on the chassis base;
   electrically connecting the PBA to the electrodes of the PDP via a flexible printed circuit (FPC), such that an anisotropic conductive film is formed between terminals of the electrodes and a terminal of the FPC, the terminals of the electrodes including silver;
   forming a dielectric layer between the electrodes and the front substrate such that exposed portions of the electrodes including silver are arranged between the anisotropic conductive film and the dielectric layer; and
   forming a sealing member surrounding the anisotropic conductive film, the terminals of the electrodes, and the terminal of the FPC, the sealing member including:
      a first sealing portion in contact with the exposed portions of the electrodes, the terminal of the FPC, and the front substrate, and
      a second sealing portion in contact with the terminals of the electrodes, the FPC, and the rear substrate, such that:
   both the first sealing portion and the second sealing portion include a surface hydrophobic modifying layer and an insulation layer therein, whereby the sealing member includes a plurality of hydrophobic modifying layers and a plurality of insulation layers, the surface hydrophobic modifying layers in the first and second sealing portions include an alkyl silicate, and the terminals of the electrodes and the FPC being enclosed by the sealing member.

13. The method as claimed in claim 12, wherein forming the sealing member includes forming one of the plurality of insulation layers between an adjacent surface hydrophobic modifying layer of the plurality of surface hydrophobic modifying layers and the terminals of the electrodes.

14. The method as claimed in claim 12, wherein forming the sealing member includes forming one of the plurality of surface hydrophobic modifying layers between an adjacent insulation layer of the plurality of insulation layers and the terminals of the electrodes.

15. The method as claimed in claim 12, wherein forming the sealing member includes applying the insulation layers and the surface hydrophobic modifying layers simultaneously on the terminals of the electrodes.

16. The method as claimed in claim 12, wherein forming the sealing member includes curing the surface hydrophobic modifying layers and the insulation layers by heat-curing or UV curing.

17. The method as claimed in claim 12, wherein forming the sealing member includes forming the first sealing portion in contact with a first side of the FPC and forming the second sealing portion in contact with a second side of the FPC, the first side of the FPC being opposite the second side of the FPC, such that the FPC is between the first and second sealing portions.

18. The plasma display device as claimed in claim 1, wherein the first sealing portion is in contact with a first side of the FPC and the second sealing portion is in contact with a second side of the FPC, the first side of the FPC being opposite the second side of the FPC, such that the FPC is between the first and second sealing portions.

* * * * *